United States Patent
Cai et al.

(10) Patent No.: US 9,064,948 B2
(45) Date of Patent: Jun. 23, 2015

(54) METHODS OF FORMING A SEMICONDUCTOR DEVICE WITH LOW-K SPACERS AND THE RESULTING DEVICE

(71) Applicant: GLOBALFOUNDARIES Inc., Grand Cayman (KY)

(72) Inventors: Xiuyu Cai, Albany, NY (US); Ruilong Xie, Albany, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 136 days.

(21) Appl. No.: 13/656,794

(22) Filed: Oct. 22, 2012

(65) Prior Publication Data

US 2014/0110798 A1    Apr. 24, 2014

(51) Int. Cl.
| | |
|---|---|
| H01L 29/78 | (2006.01) |
| H01L 21/283 | (2006.01) |
| H01L 29/49 | (2006.01) |
| H01L 29/66 | (2006.01) |
| H01L 21/768 | (2006.01) |
| H01L 29/51 | (2006.01) |

(52) U.S. Cl.
CPC ............ *H01L 29/78* (2013.01); *H01L 29/4966* (2013.01); *H01L 29/4991* (2013.01); *H01L 29/51* (2013.01); *H01L 29/6653* (2013.01); *H01L 29/66545* (2013.01); *H01L 29/66636* (2013.01); *H01L 21/7682* (2013.01)

(58) Field of Classification Search
CPC ............ H01L 29/6656; H01L 29/6653; H01L 21/283; H01L 29/51
See application file for complete search history.

(56) References Cited

U.S. PATENT DOCUMENTS

| | | |
|---|---|---|
| 6,194,748 B1 | 2/2001 | Yu |
| 6,348,385 B1 | 2/2002 | Cha et al. |
| 6,583,043 B2 | 6/2003 | Shroff et al. |
| 6,638,849 B2 | 10/2003 | Ting et al. |
| 6,717,269 B2 | 4/2004 | Shroff et al. |
| 6,724,051 B1 | 4/2004 | Woo et al. |
| 7,179,745 B1 | 2/2007 | Waite et al. |
| 7,352,053 B2 | 4/2008 | Chang |
| 7,352,065 B2 | 4/2008 | Dorfman |
| 7,687,364 B2 | 3/2010 | Sell |
| 7,781,332 B2 | 8/2010 | Arnold et al. |
| 7,790,540 B2 | 9/2010 | Yang et al. |
| 7,829,943 B2 | 11/2010 | Sell |
| 7,927,964 B2 | 4/2011 | Schrinsky |
| 8,129,843 B2 | 3/2012 | Arnold et al. |
| 8,222,100 B2 | 7/2012 | Cheng et al. |

(Continued)

*Primary Examiner* — Kimberly Rizkallah
*Assistant Examiner* — Mounir Amer
(74) *Attorney, Agent, or Firm* — Amerson Law Firm, PLLC

(57) ABSTRACT

One method disclosed herein includes forming at least one sacrificial sidewall spacer adjacent a sacrificial gate structure that is formed above a semiconducting substrate, removing at least a portion of the sacrificial gate structure to thereby define a gate cavity that is laterally defined by the sacrificial spacer, forming a replacement gate structure in the gate cavity, removing the sacrificial spacer to thereby define a spacer cavity adjacent the replacement gate structure, and forming a low-k spacer in the spacer cavity. A novel device disclosed herein includes a gate structure positioned above a semiconducting substrate, wherein the gate insulation layer has two upstanding portions that are substantially vertically oriented relative to an upper surface of the substrate. The device further includes a low-k sidewall spacer positioned adjacent each of the vertically oriented upstanding portions of the gate insulation layer.

14 Claims, 11 Drawing Sheets

(56) References Cited

U.S. PATENT DOCUMENTS

| | | |
|---|---|---|
| 8,268,181 B2 | 9/2012 | Srivastava et al. |
| 8,288,296 B2 | 10/2012 | Wong et al. |
| 8,309,424 B2 | 11/2012 | Schrinsky |
| 2004/0132250 A1 | 7/2004 | Hazani |
| 2004/0235299 A1 | 11/2004 | Srivastava et al. |
| 2004/0238123 A1 | 12/2004 | Becknell et al. |
| 2007/0063277 A1 | 3/2007 | Belyansky et al. |
| 2008/0090360 A1* | 4/2008 | Krivokapic .................. 438/283 |
| 2008/0272445 A1 | 11/2008 | Dyer |
| 2009/0001480 A1* | 1/2009 | Cheng .......................... 257/387 |
| 2009/0075472 A1 | 3/2009 | Arnold et al. |
| 2011/0260258 A1* | 10/2011 | Zhu et al. ..................... 257/369 |
| 2011/0269278 A1 | 11/2011 | Hoentschel |
| 2012/0153405 A1 | 6/2012 | Heinrich et al. |
| 2012/0329269 A1 | 12/2012 | Arnold et al. |

\* cited by examiner

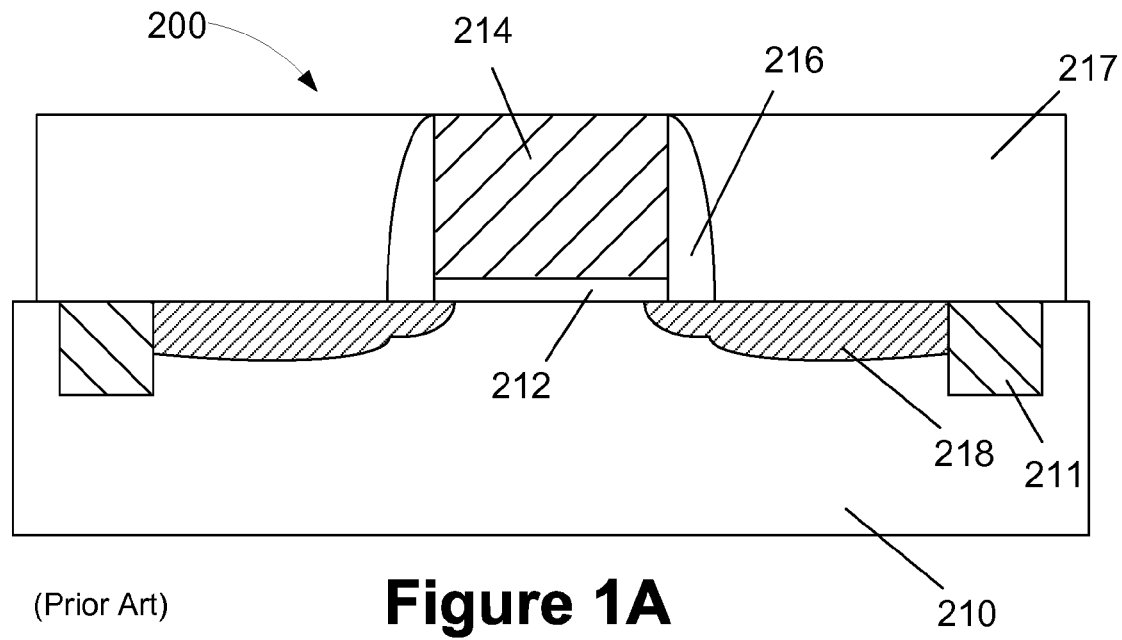
(Prior Art) Figure 1A
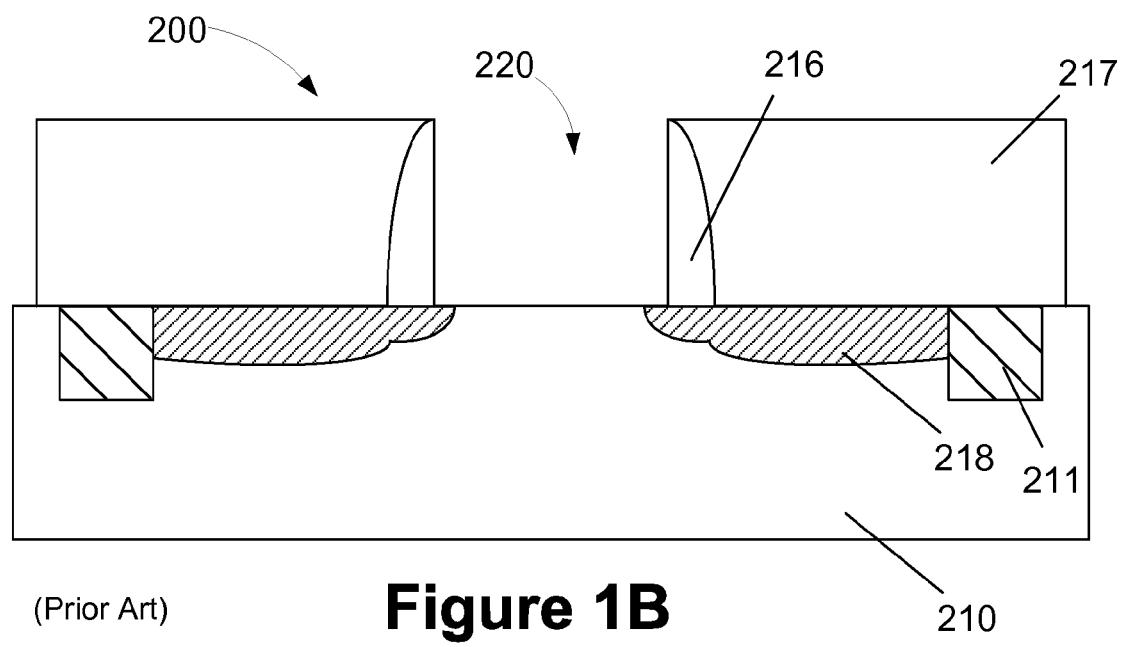
(Prior Art) Figure 1B

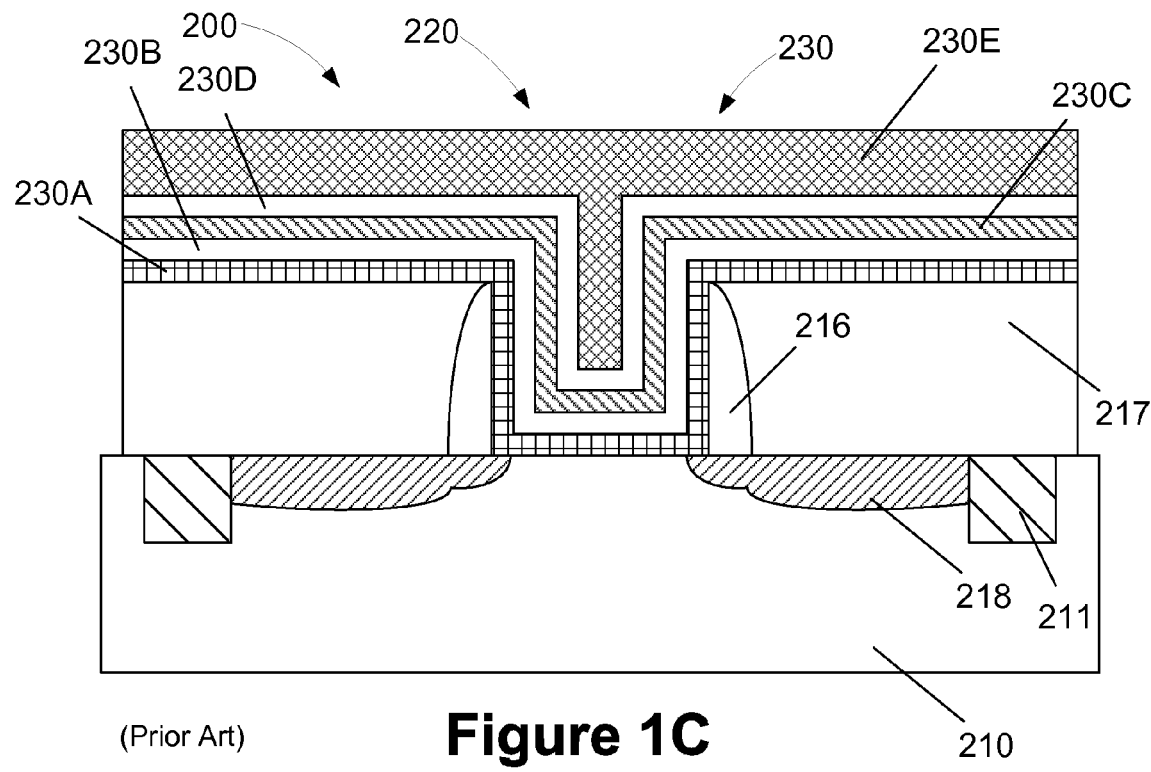
(Prior Art) Figure 1C
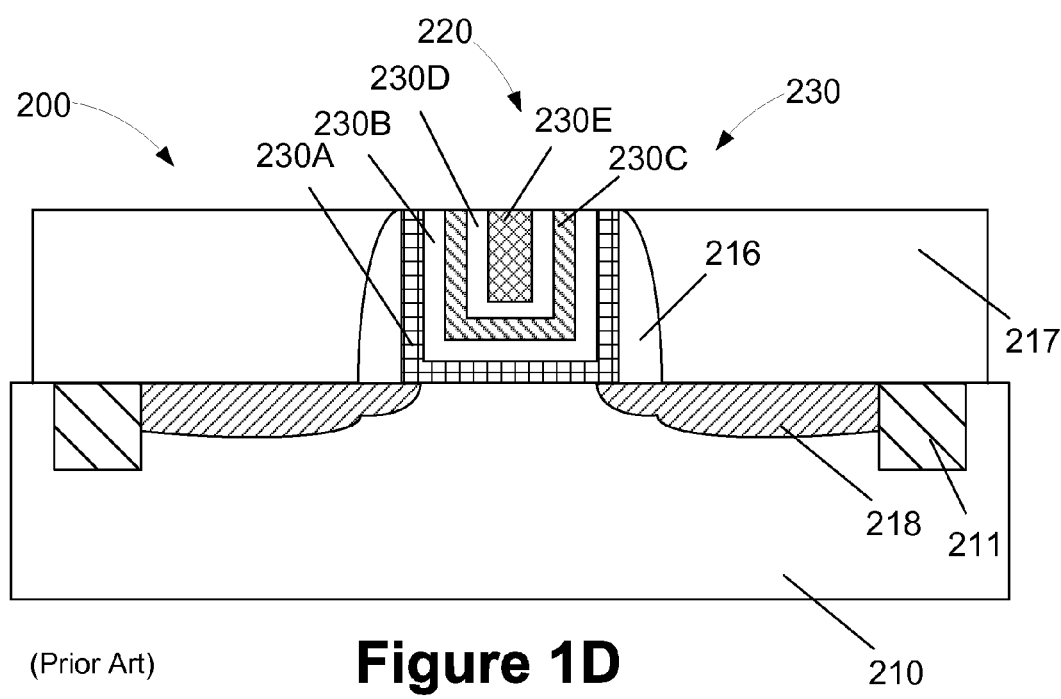
(Prior Art) Figure 1D

METHODS OF FORMING A SEMICONDUCTOR DEVICE WITH LOW-K SPACERS AND THE RESULTING DEVICE

BACKGROUND OF THE INVENTION

1. Field of the Invention

Generally, the present disclosure relates to the manufacture of sophisticated semiconductor devices, and, more specifically, to various methods of forming a semiconductor device with low-k spacers and various semiconductor devices incorporating such low-k spacers.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer. A field effect transistor, whether an NFET or a PFET device, is a planar device that typically includes a source region, a drain region, a channel region that is positioned between the source region and the drain region, a gate insulation layer and a gate electrode positioned above the gate insulation layer over the channel region. By applying an appropriate voltage to the gate electrode, the channel region becomes conductive and current is allowed to flow from the source region to the drain region.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-20 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate last technique. As shown in FIG. 1A, the process includes the formation of a basic transistor structure 200 above a semiconducting substrate 210 in an active area defined by a shallow trench isolation structure 211. At the point of fabrication depicted in FIG. 1A, the device 200 includes a sacrificial gate insulation layer 212, a dummy or sacrificial gate electrode 214, sidewall spacers 216, a layer of insulating material 217 and source/drain regions 218 formed in the substrate 210. The various components and structures of the device 200 may be formed using a variety of different materials and by performing a variety of known techniques. For example, the sacrificial gate insulation layer 212 may be comprised of silicon dioxide, the sacrificial gate electrode 214 may be comprised of polysilicon, the sidewall spacers 216 may be comprised of silicon nitride and the layer of insulating material 217 may be comprised of silicon dioxide. The source/drain regions 218 may be comprised of implanted dopant materials (N-type dopants for NFET devices and P-type dopants for PFET devices) that are implanted into the substrate 210 using known masking and ion implantation techniques. Of course, those skilled in the art will recognize that there are other features of the transistor 200 that are not depicted in the drawings for purposes of clarity. For example, so-called halo implant regions are not depicted in the drawings, as well as various layers or regions of silicon/germanium that are typically found in high performance PFET transistors. At the point of fabrication depicted in FIG. 1A, the various structures of the device 200 have been formed and a chemical mechanical polishing process (CMP) has been performed to remove any materials above the sacrificial gate electrode 214 (such as a protective cap layer (not shown) comprised of silicon nitride) so that at least the sacrificial gate electrode 214 may be removed.

As shown in FIG. 1B, one or more etching processes are performed to remove the sacrificial gate electrode 214 and the sacrificial gate insulation layer 212 to thereby define a gate cavity 220 where a replacement gate structure will subsequently be formed. A masking layer that is typically used in such etching processes is not depicted for purposes of clarity. Typically, the sacrificial gate insulation layer 212 is removed as part of the replacement gate technique, as depicted herein. However, the sacrificial gate insulation layer 212 may not be removed in all applications.

Next, as shown in FIG. 1C, various layers of material that will constitute a replacement gate structure 230 are formed in the gate cavity 220. The materials used for such replacement gate structures 230 may vary depending upon the particular application. Even in cases where the sacrificial gate insulation layer 212 is intentionally removed, there will typically be a very thin native oxide layer (not shown) that forms on the substrate 210 within the gate cavity 220. In one illustrative example, the replacement gate structure 230 is comprised of a high-k gate insulation layer 230A, such as hafnium oxide, having a thickness of approximately 2 nm, a first metal layer 230B (e.g., a layer of titanium nitride with a thickness of about 1-2 nm), a second metal layer 230C (e.g., a layer of tantalum nitride with a thickness of about 1-2 nm), a third metal layer 230D (e.g., a layer of titanium nitride with a thickness of about 5 nm) and a bulk metal layer 230E, such as aluminum. Ultimately, as shown in FIG. 1D, one or more CMP processes are performed to remove excess portions of the gate insulation layer 230A, the first metal layer 230B, the second metal layer 230C, the third metal layer 230D and the bulk metal layer 230E positioned outside of the gate cavity 220 to thereby define the replacement gate structure 230.

As device dimensions have decreased and packing densities have increased, parasitic capacitance is becoming more important as a factor to consider to improve the operating speed of transistor devices. Typically, as noted above, the gate structure of a transistor will include at least one sidewall spacer positioned adjacent the gate structure. Typically, the sidewall spacers are made of silicon nitride and they are normally formed very soon after the final gate structure is formed using a "gate-first" manufacturing technique or after the sacrificial gate structure is formed for devices manufactured using the replacement gate technique. One of the primary purposes of the silicon nitride spacers for "gate-first" devices is to protect the gate materials during subsequent processing operations. For "replacement gate" devices, the spacers also serve to protect the replacement gate structure and to define the gate cavity in the replacement gate manufacturing process.

Unfortunately, the k-value of silicon nitride is relatively high, e.g., about 7-8. The presence of the silicon nitride spacer material (with a relatively high k-value) tends to increase the parasitic capacitance between the conductive gate electrode and conductive contacts (like trench silicide regions) that are formed in close proximity to the gate structure of the transistor. This problem has become even more problematic as packing densities have increased which causes the gate structures of adjacent transistor to be positioned ever closer to one another. The use of so-called self-aligned contacts has also exacerbated this problem.

The use of alternative materials for the sidewall spacers, such as materials having k values less than about 6 or so, has been problematic. Most of such low-k materials are based upon carbon or boron doped silicon nitride. The low-k material, when used as a traditional spacer material, is subjected to a reactive ion etching (RIE) process to define the spacer from such a low-k material. The RIE process tends to deplete the carbon and boron, thereby effectively increasing the k-value of the low-k material. Such low-k materials also tend to be weaker mechanically than silicon nitride, which makes them less capable of standing up to the rigors of processing after they are formed. Moreover, such spacers are typically subjected to relatively high temperature source/drain anneal processes, which also tends to deplete the carbon and boron from such low-k materials.

The present disclosure is directed to various methods of forming a semiconductor device with low-k spacers and various semiconductor devices incorporating such low-k spacers that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device with low-k spacers and various semiconductor devices incorporating such low-k spacers. One illustrative method disclosed herein includes forming a sacrificial gate structure above a semiconducting substrate, forming at least one sacrificial sidewall spacer adjacent the sacrificial gate structure, removing at least a portion of the sacrificial gate structure to thereby define a gate cavity that is laterally defined by the sacrificial sidewall spacer, forming a replacement gate structure in the gate cavity, after forming the replacement gate structure, removing the sacrificial sidewall spacer to thereby define a spacer cavity adjacent the replacement gate structure, and forming a low-k spacer in the spacer cavity.

Another illustrative method includes forming a sacrificial gate structure above a semiconducting substrate, forming a first sacrificial sidewall spacer adjacent the sacrificial gate structure, forming a second sacrificial sidewall spacer adjacent the first sacrificial sidewall spacer and performing a first etching process to remove the second sacrificial sidewall spacer relative to the first sacrificial sidewall spacer to thereby define a first spacer cavity. In this embodiment, the method further includes the steps of forming a third sacrificial sidewall spacer in the first spacer cavity adjacent the first sacrificial sidewall spacer, after forming the third sacrificial sidewall spacer, removing at least a portion of the sacrificial gate structure to thereby define a gate cavity that is laterally defined by the first sacrificial sidewall spacer, forming a replacement gate structure in the gate cavity, after forming the replacement gate structure, removing at least the first and third sacrificial sidewall spacers to thereby define a second spacer cavity adjacent the replacement gate structure, and forming a low-k spacer in the second spacer cavity.

One example of a novel device disclosed herein includes a gate structure positioned above a semiconducting substrate, wherein the gate structure includes a gate insulation layer and a gate electrode. In this example, the gate insulation layer has two upstanding portions that are substantially vertically oriented relative to an upper surface of the substrate. The device further includes a low-k sidewall spacer positioned adjacent each of the vertically oriented upstanding portions of the gate insulation layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a so-called "gate last" or "replacement gate" approach.

Figure 2A:
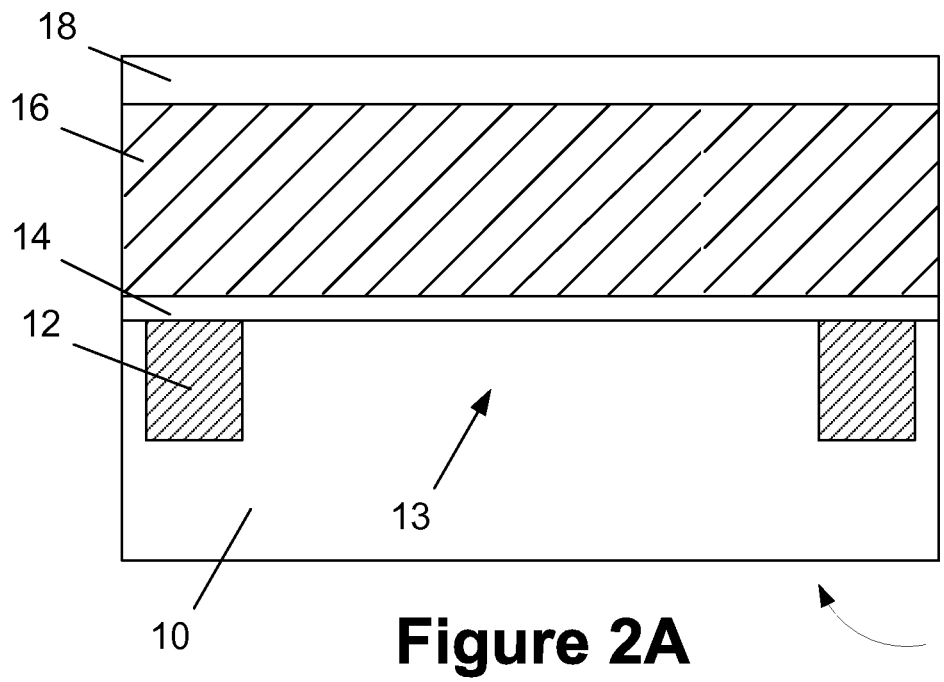
FIGS. 2A-2Q depict one illustrative method disclosed herein for forming an illustrative semiconductor device with low-k spacers.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a semiconductor device with low-k spacers and various semiconductor devices incorporating such low-k spacers. As will be readily apparent to those skilled in the art upon a complete reading of the present application, the methods disclosed herein may be employed with a variety of different technologies, e.g., NMOS, PMOS, CMOS, etc., and in manufacturing a variety of different devices, including, but not limited to, logic devices, memory devices, etc. With reference to the attached figures, various illustrative embodiments of the methods and devices disclosed herein will now be described in more detail.

In general, the present disclosure is directed to a novel method of forming a semiconductor device with low-k spacers and various semiconductor devices incorporating such low-k spacers. As will be appreciated by those skilled in the art after a complete reading of the present application, the inventions disclosed herein may be employed in forming planar transistor devices (NFET or PFET devices), as well as so-called 3-D devices, such as FinFETs. For purposes of disclosure, reference will be made to an illustrative process flow for forming a planar transistor device. However, the inventions disclosed herein should not be considered to be limited to such an illustrative example.

FIG. 2A is a simplified view of an illustrative semiconductor device 100 at an early stage of manufacturing. An isolation region 12 has been formed in a semiconducting substrate 10 which thereby defines an active region 13 where the device 100 will be formed. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. The substrate 10 may be made of silicon or it may be made of materials other than silicon. Thus, the terms "substrate" or "semiconducting substrate" should be understood to cover all semiconducting materials and all forms of such materials.

With continuing reference to FIG. 2A, the process begins with the formation of several layers of material above the substrate 10: a sacrificial gate insulation layer 14, a sacrificial gate electrode layer 16 and a mask layer 18. Such layers may be formed using a variety of different materials and by performing a variety of known techniques. For example, the sacrificial gate insulation layer 14 may be comprised of silicon dioxide, the sacrificial gate electrode layer 16 may be comprised of polysilicon or amorphous silicon and the mask layer 18 may be comprised of silicon nitride. The sacrificial gate insulation layer 14, sacrificial gate electrode layer 16 and the mask layer 18 may be of any desired thickness or configuration. Moreover, the mask layer 18 could be comprised of multiple layers of material, such as, for example, a combination of a silicon nitride layer and a layer of silicon dioxide. Thus, the particular form and composition of the mask layer 18 and the manner in which it is made should not be considered a limitation of the present invention. Of course, those skilled in the art will recognize that there are other features of the transistor 100 that are not depicted in the drawings so as not to obscure the present invention. For example, so-called halo implant regions and various layers or regions of silicon/germanium that are typically found in high performance PFET transistors are not depicted in the drawings. The layers of material depicted in FIG. 2A may be formed by any of a variety of different known techniques, e.g., a chemical vapor deposition (CVD) process, an atomic layer deposition (ALD) process, a thermal growth process, etc.

Figure 2B:
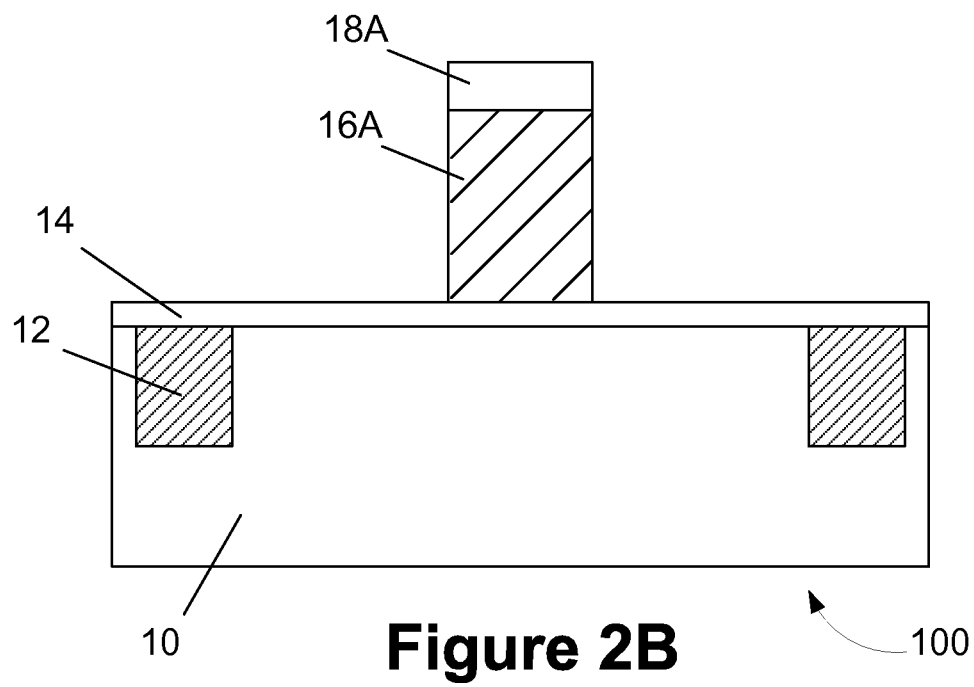

As shown in FIG. 2B, one or more patterning and etching processes are performed to define the sacrificial gate electrode 16A and the gate cap layer 18A. Typically, the mask layer 18 is patterned using known photolithography and etching techniques to thereby define a patterned mask layer. Alternatively, the mask layer 18 may be patterned using known sidewall image transfer techniques. Thereafter one or more etching processes are performed through the patterned mask layer to remove exposed portions of the sacrificial gate electrode layer 16 to thereby define the depicted sacrificial gate electrode 16A.

Figure 2C:
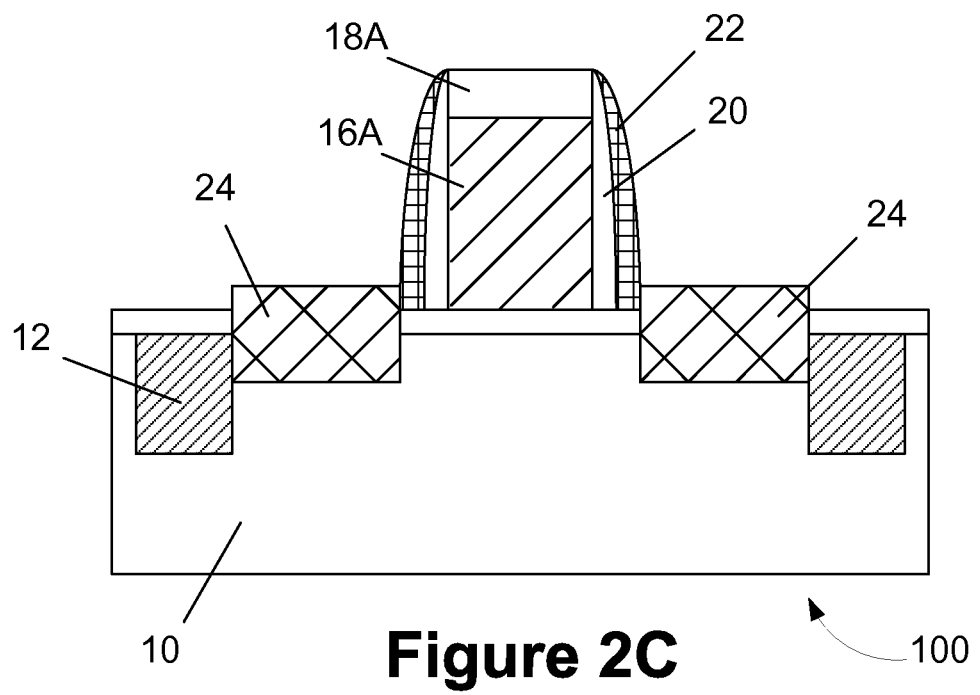

FIG. 2C depicts the device 100 after several process operations have been performed. First, a first sacrificial sidewall spacer 20 was formed adjacent the sacrificial gate electrode 16A. Thereafter, a second sacrificial 22 was formed adjacent the first sidewall spacer 20. Then, illustrative raised source/drain regions 24 were formed for the device 100. However, such raised source/drain regions 24 need not be formed in all applications, and the disclosed inventions should not be considered to be limited to such an illustrative configuration. The first and second sacrificial sidewall spacers 20, 22 may be formed by depositing a layer of spacer material and thereafter performing an anisotropic etching process. The first sacrificial sidewall spacer 20 may be comprised of carbon or other conformably deposited films that are made of a material that exhibits etch selectivity relative to silicon nitride and silicon dioxide, i.e., silicon nitride or silicon dioxide may be selectively removed from the first sacrificial sidewall spacer 20, and the spacer 20 may have a thickness at its base of about 1-2 nm. The second sacrificial sidewall spacer 22 may be comprised of silicon nitride and the spacer 22 may have a thickness at its base of about 5-10 nm. The raised source/drain region 24 may be formed by forming cavities in the substrate 10 and thereafter performing an epitaxial deposition process to thereby form doped semiconductor material in the cavities in the substrate 10. Although not depicted in the drawings, an extension implantation process may be performed to form extension implant regions (not shown) in the substrate 10 prior to or after the formation of the first and second sacrificial sidewall spacers 20, 22.

Figure 2D:
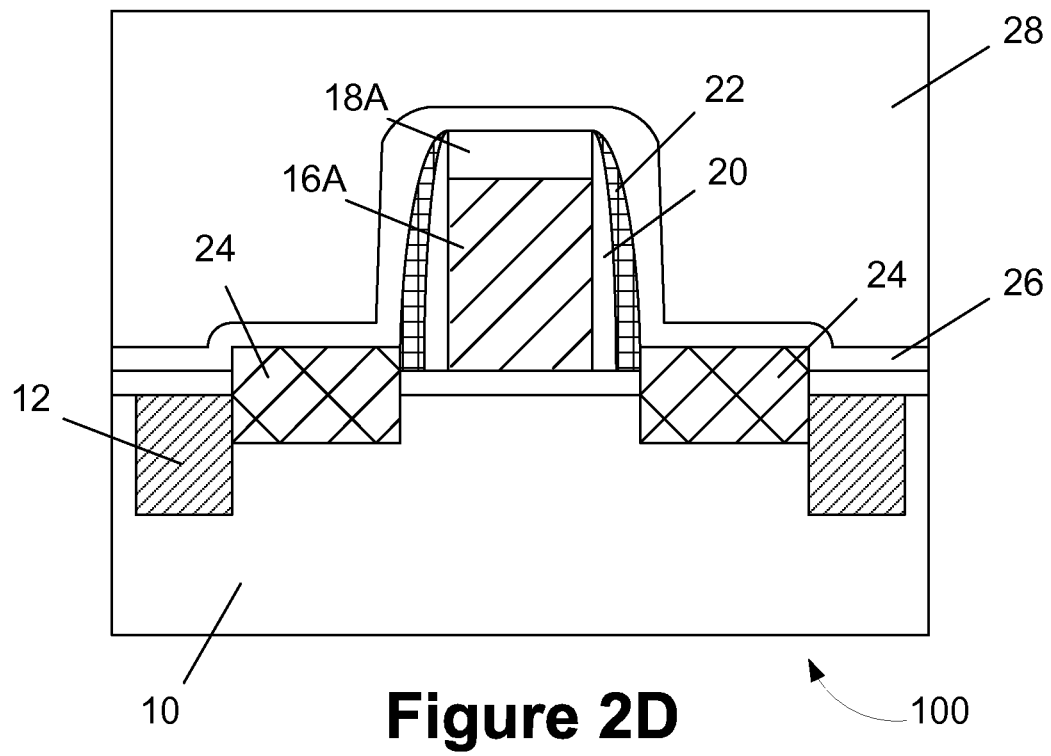

Next, as shown in FIG. 2D, a conformably deposited layer of insulating material 26, e.g., a conformably deposited layer of silicon nitride, having a thickness of about 2-5 nm is formed on the device 100. Thereafter, a layer of insulating material 28 is blanket-deposited over the device 100. In one illustrative example, the layer of insulating material 28 may be a silicon dioxide material, such as a flowable oxide material, and it may be formed using traditional techniques, e.g., CVD, spin-on/cure, etc.

Figure 2E:
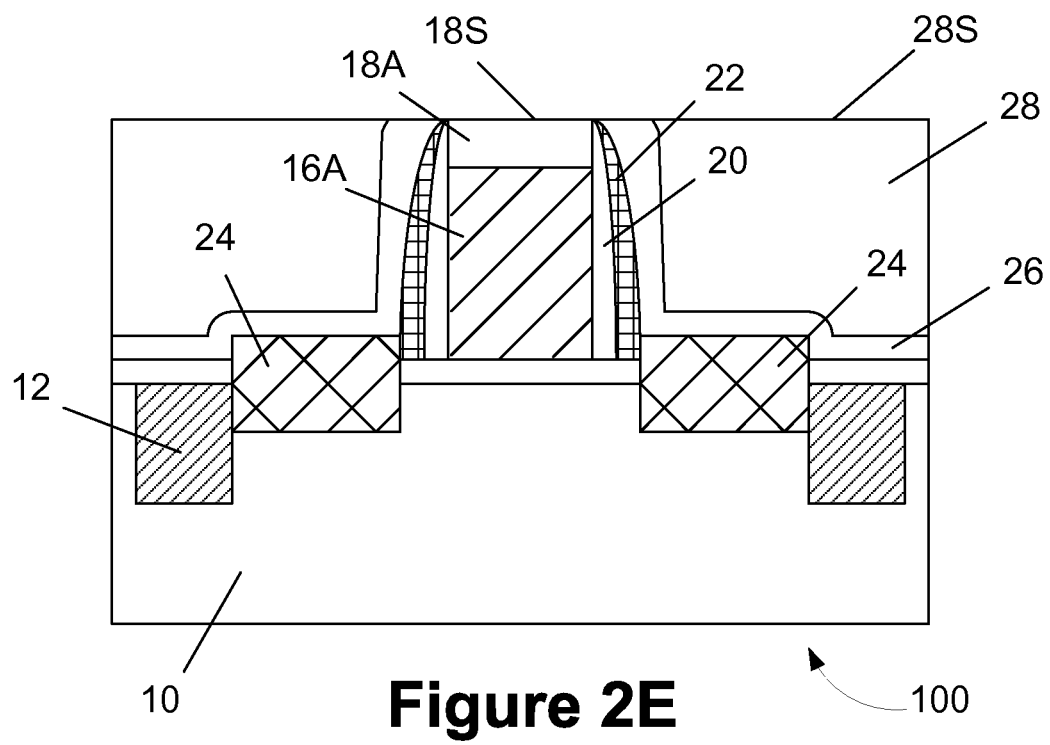

FIG. 2E depicts the device 100 after one or more CMP processes have been performed on the insulating layer 28. The CMP process stops on the upper surface 18S of the gate cap layer 18A and thereby results in the layer of insulating material 28 having a polished upper surface 28S that is substantially planar with the surface 18S.

Figure 2F:
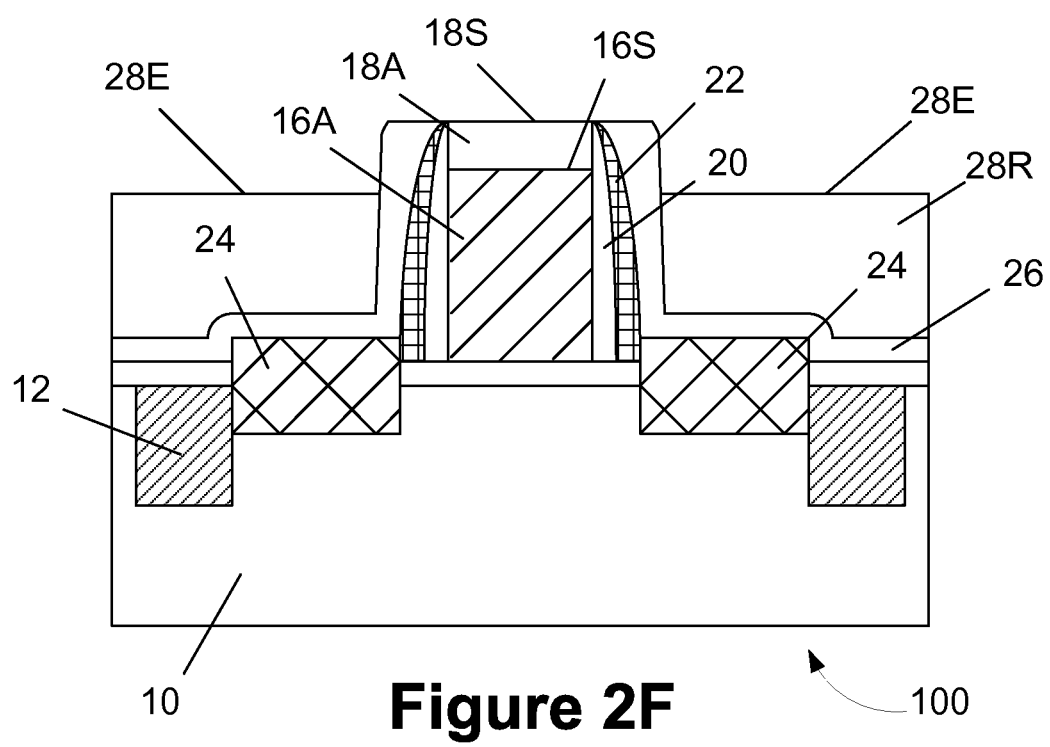

Then, as shown in FIG. 2F, a material removal process is performed on the layer of insulating material 28 to reduce its overall thickness and thereby define a reduced thickness layer of insulating material 28R having an upper surface 28E. In one illustrative embodiment, the material removal process is a highly-controllable chemical oxide atomic layer removal process that may be performed using Applied Materials' SiCoNi process or the well-known COR process from Tokyo Electron. In one example, this removal process should be controlled such that the upper surface 28E of the reduced thickness layer of insulating material 28R is positioned slightly below (e.g., about 3-10 nm) the upper surface 16S of the sacrificial gate electrode 16A.

Figure 2G:
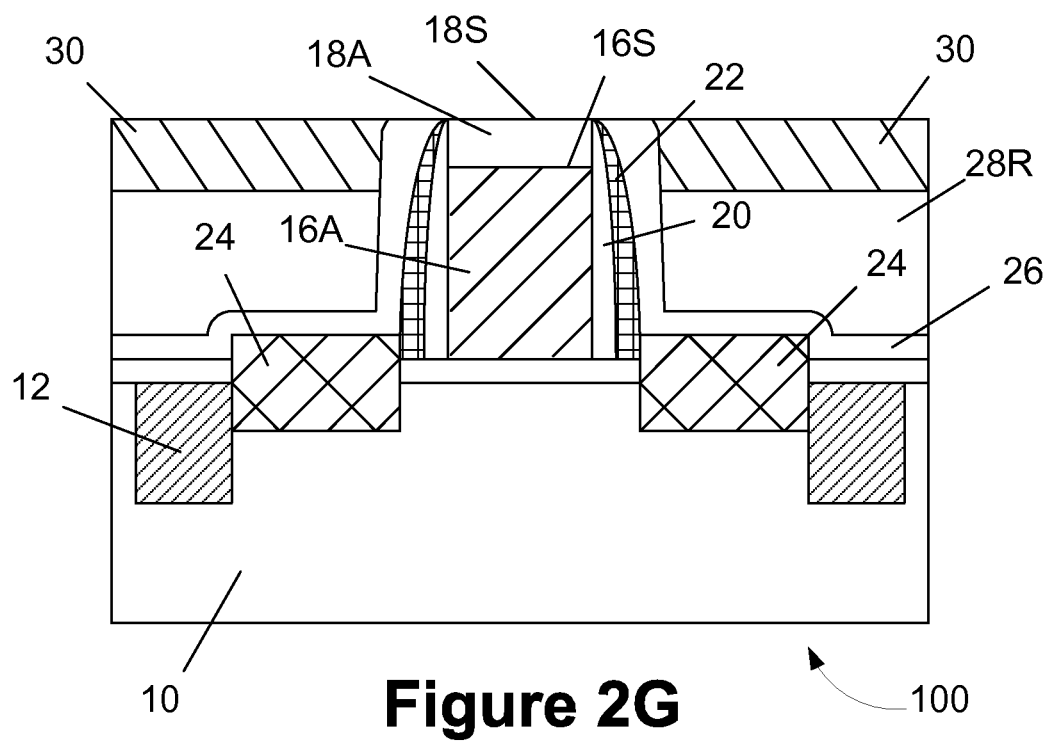

Next, as shown in FIG. 2G, a layer of insulating material 30 is formed above the reduced thickness layer of insulating material 28R and a CMP process is performed on the reduced thickness layer of insulating material 28R using the gate cap 18A as a polish stop. This results in the structure depicted in FIG. 2G. In one illustrative embodiment, the layer of insulating material 30 is an HDP oxide, a better quality oxide material, that is more etch resistant than the flowable oxide layer of insulating material 28R. In one illustrative example, the layer of insulating material 30 may have a thickness that falls within the range of about 5-20 nm.

Figure 2H:
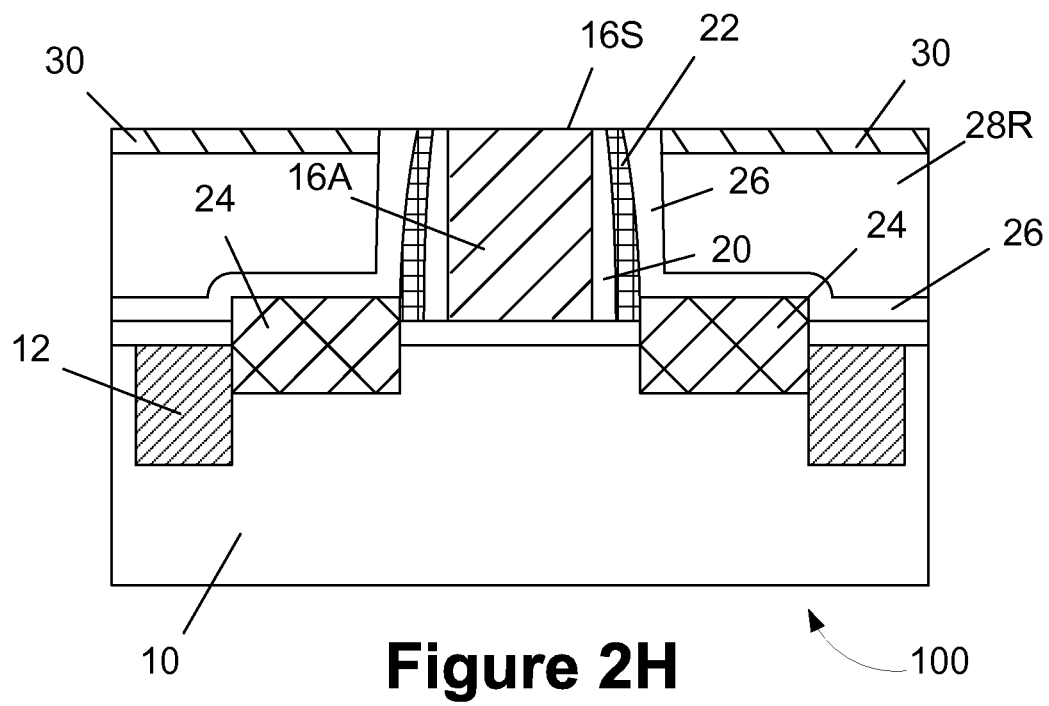

Next, as shown in FIG. 2H, another CMP process is performed on the layer of insulating material 30, the gate cap layer 18A, and the upper portions of the first and second sacrificial sidewall spacers 20, 22 using the sacrificial gate electrode 16A as a polish stop. This CMP process exposes the upper surface 16S of the sacrificial gate electrode 16A.

Figure 2I:
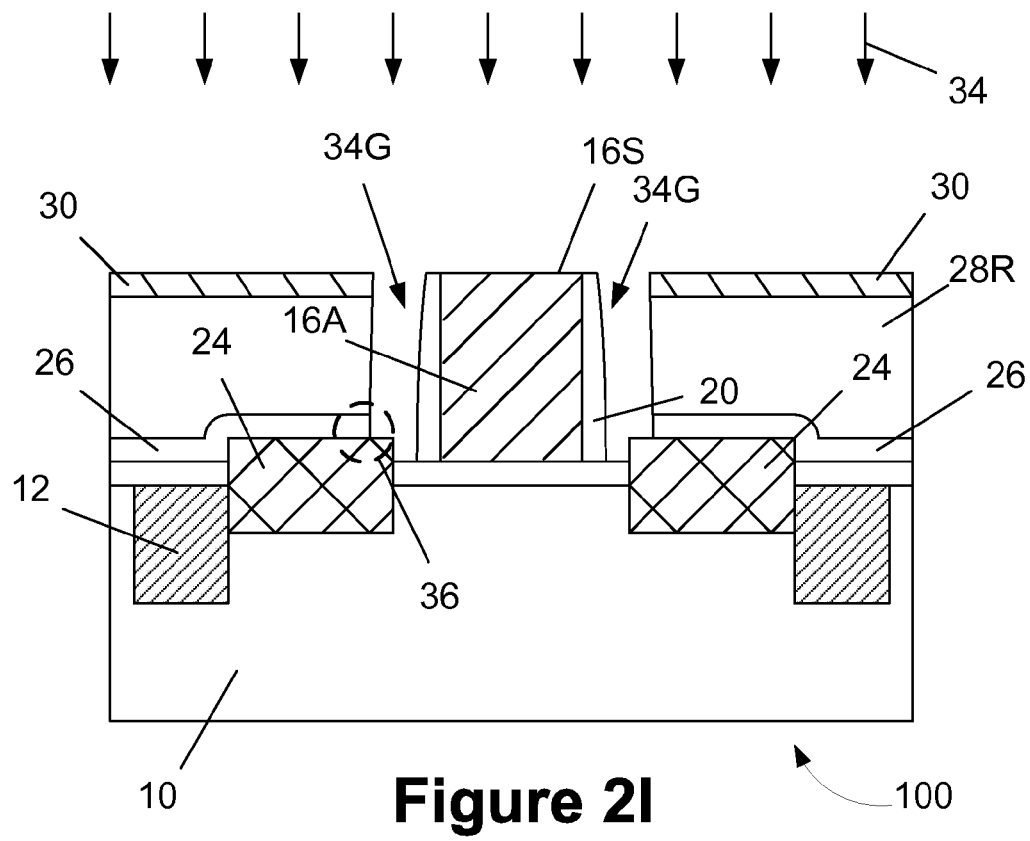

Then, as shown in FIG. 2I, a wet etching process 34 is performed to remove the residual portions of the second sacrificial sidewall spacers 22 and the layer of insulating material 26, i.e., the etching process 34 removes exposed silicon nitride material while leaving the first sacrificial sidewall spacers 20 intact. The etching process 34 results in the formation of a plurality of first spacer cavities or gaps 34G adjacent the first sacrificial sidewall spacers 20. During the etching process 34, there may be some undercutting of the layer of insulating material 26 in the area 36. However, in this embodiment, the parameters of the etching process are controlled so as to limit or eliminate the amount of undercutting in the area 36.

Figure 2J:
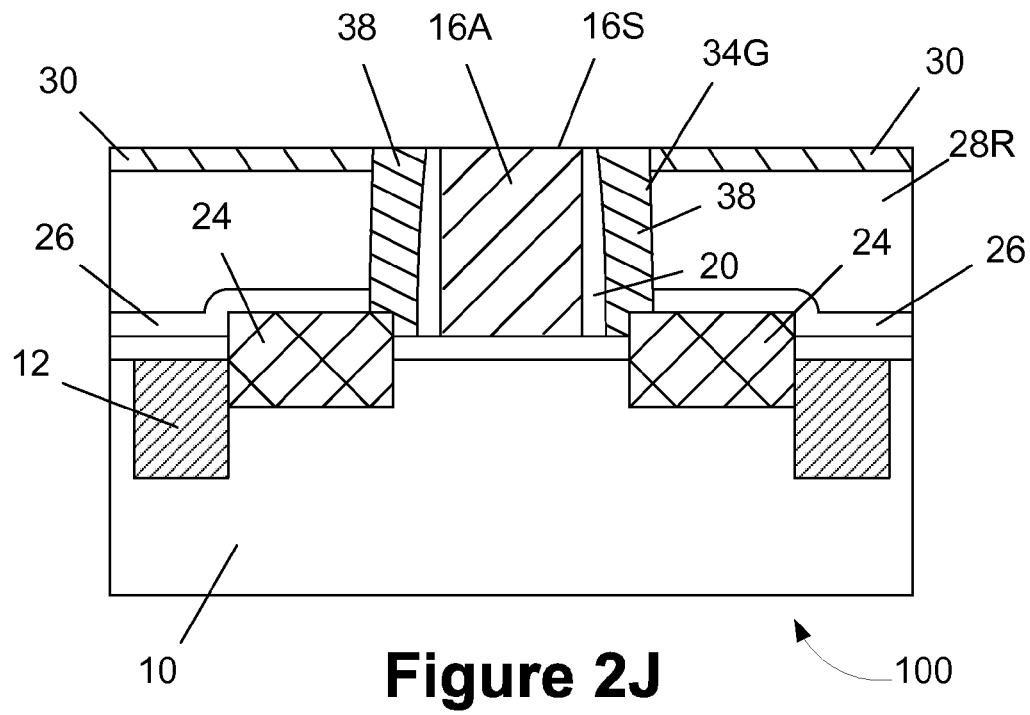

FIG. 2J depicts the device 100 after a plurality of third sacrificial sidewall spacers 38 have been formed in the first spacer cavities 34G adjacent the first sacrificial sidewall spacers 20. The structure depicted in FIG. 2J is the result of several process operations. Initially, in one embodiment, a layer of third spacer material (not shown) used for the third sacrificial sidewall spacers 38 is blanket-deposited across the device 100 above the layer of insulating material 30, above the upper surface 16S of the sacrificial gate structure 16A and in the first spacer cavities 34G. Thereafter, a dry etching process is performed on the layer of third spacer material 38 so as to clear the third spacer material from above the upper surface of the layer of insulating material 30 and from above the upper surface 16S of the sacrificial gate structure 16A. As the third spacer material layer is etched away, upper portions of the first sacrificial sidewall spacers 20 are also removed during this etching process. Alternatively, a CMP process (that stops on the layer 30) could be performed to remove the excess material of the third spacer material layer to thereby form the third sacrificial spacers 38 in the first spacer cavities 34G adjacent the first sacrificial sidewall spacers 20. The third sacrificial sidewall spacers 38 may be made of the same material as the first sacrificial sidewall spacers 20, as discussed above.

Figure 2K:
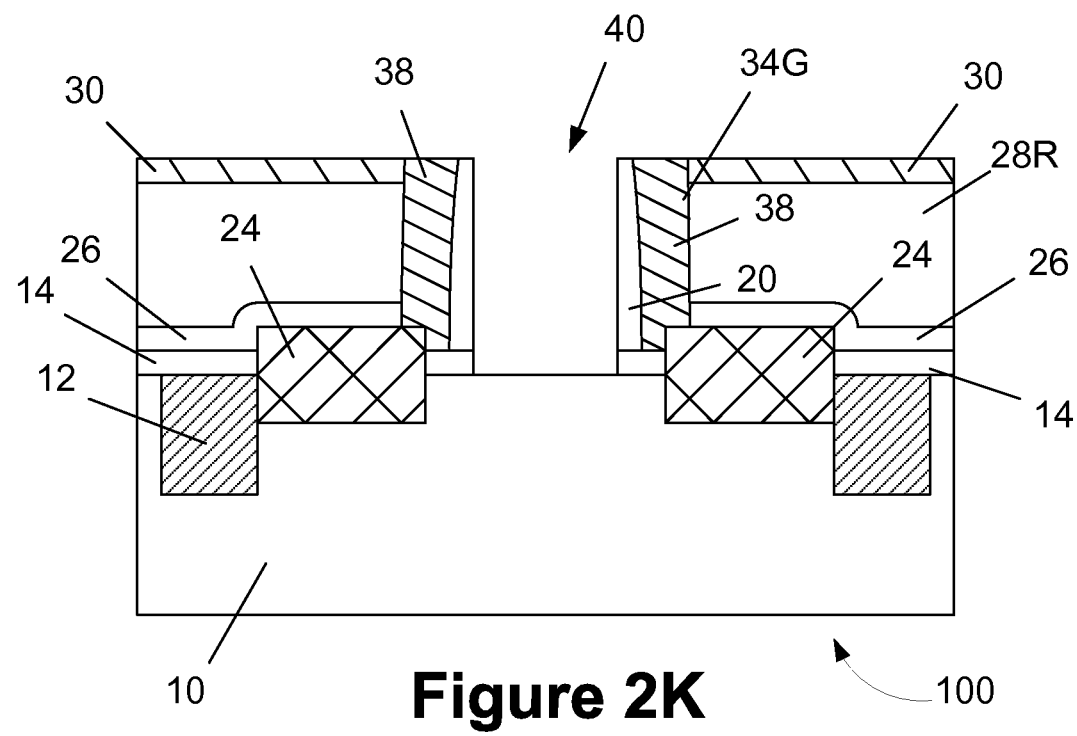
Figure 2L:
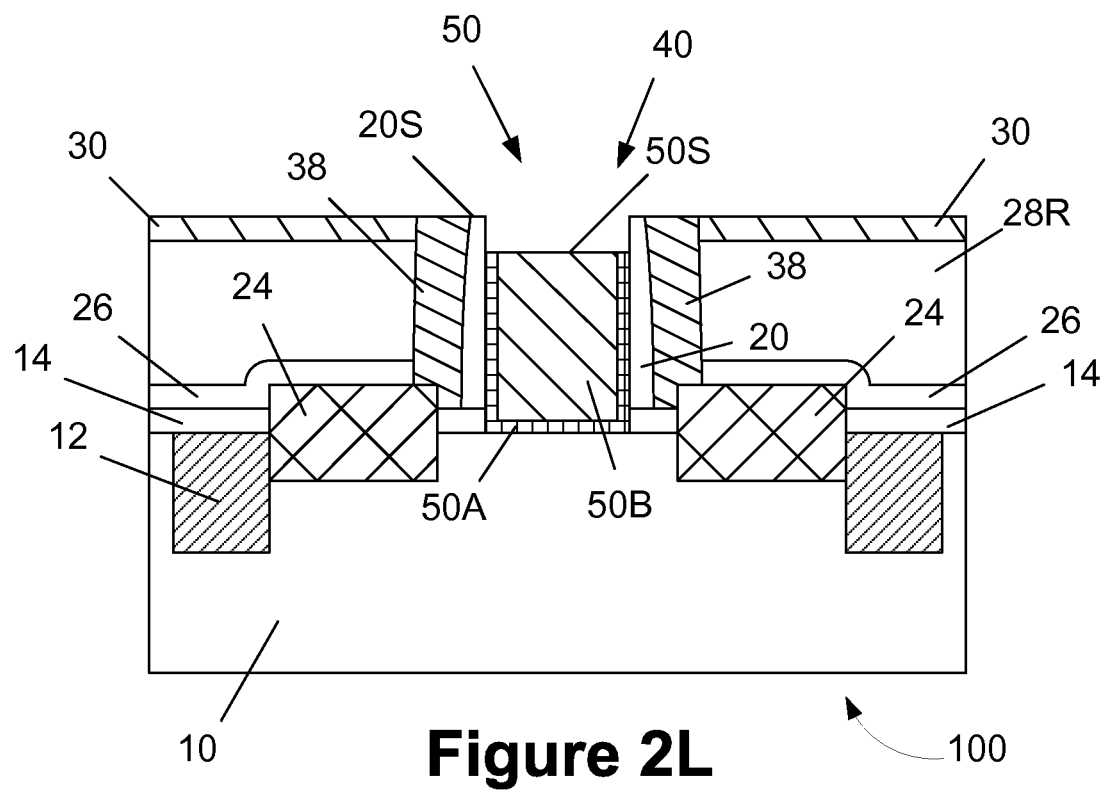

FIGS. 2K and 2L depict several process operations that are directed to the removal of the sacrificial gate electrode 16A and the sacrificial gate insulation layer 14, and the formation of a replacement gate structure 50 for the device 100. As shown in FIG. 2K, one or more etching processes are performed to remove the sacrificial gate electrode 16A and portions of the sacrificial gate insulation layer 14 exposed by the removal of the sacrificial gate electrode 16A to thereby define a gate cavity 40 where the replacement gate structure 50 will subsequently be formed. Note that the gate cavity 40 is laterally defined by the first sacrificial sidewall spacers 20 at this point in the process flow. A masking layer (not shown) that is typically used in such an etching process is not depicted for purposes of clarity. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 10 within the gate cavity 40.

As shown in FIG. 2L, a schematically depicted replacement gate structure 50 for the device 100 is formed in the gate cavity 40. The schematically depicted gate structure 50 includes an illustrative gate insulation layer 50A and an illustrative gate electrode 50B. As will be recognized by those skilled in the art after a complete reading of the present application, the gate structure 50 of the device 100 depicted in the drawings, i.e., the gate insulation layer 50A and the gate electrode 50B, is intended to be representative in nature. For example, the gate insulation layer 50A may be comprised of a variety of different materials, such as, for example, silicon dioxide, a so-called high-k (k greater than 10) insulation material (where k is the relative dielectric constant), etc. The gate electrode 50B may be comprised of one or more layers of conductive material, e.g., polysilicon, one or more layers of metal, etc. As noted above, in some cases, if desired, a metal layer (not shown), such as a very thin work function adjusting metal (e.g., a layer of titanium nitride), may be formed on the high-k gate insulation layer 50A. As will be recognized by those skilled in the art after a complete reading of the present application, the insulating materials and the metal layer(s) that are part of the replacement gate structure 50 may be of any desired construction and comprised of any of a variety of different materials. Additionally, the replacement gate structure 50 for an NFET device may have different material combinations as compared to a replacement gate structure 50 for a PFET device. Thus, the particular details of construction of replacement gate structure 50, and the manner in which such replacement gate electrode structure 50 is formed, should not be considered a limitation of the present invention unless such limitations are expressly recited in the attached claims.

In one illustrative example, the replacement gate formation process begins with performing a conformal deposition process to form the high-k gate insulation layer 50A in the gate cavity 40 and above the layer of insulating material 30. Thereafter, the conductive materials that will be used for the gate electrode 50B, e.g., one or more metal layers, will be deposited across the devices by performing one or more conformal deposition processes and/or one or more blanket-deposition processes so as to substantially overfill the gate cavity 40 with conductive gate electrode material(s). At that point, one or more CMP processes are performed to remove excess portions of the gate insulation layer 50A and the layers of conductive material that will be used to form the gate electrode 50B are positioned above the layer of insulating material 30. This CMP process essentially planarizes the upper surface of the materials of the gate structure 50 with the upper surface of the layer of insulating material 30. Thereafter, an etching process is performed to reduce the height of the replacement gate structure 50 such that the upper surface 50S of the replacement gate electrode 50B is positioned below the upper surface 20S of the first sacrificial sidewall spacers 20.

Figure 2M:
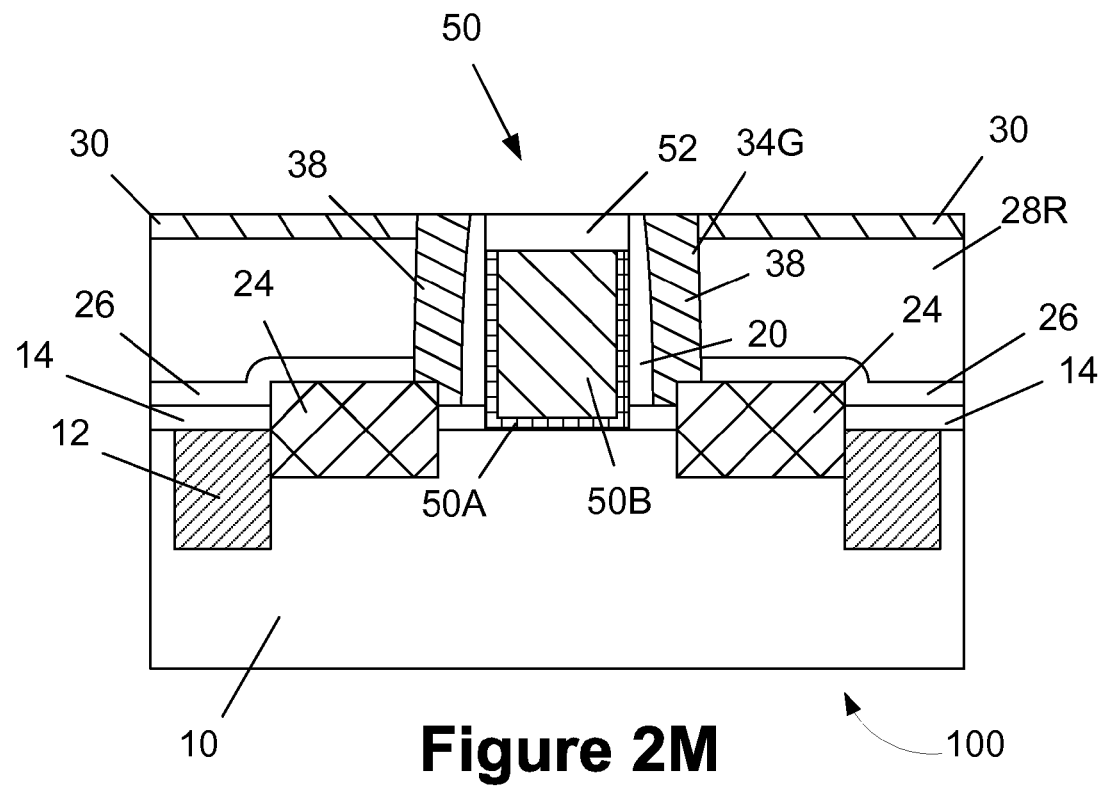

Next, as shown in FIG. 2M, an illustrative gate cap layer 52, comprised of, for example, silicon nitride, has been formed above the recessed gate structure 50. The gate cap layer 52 may be formed by depositing a layer of the cap material and thereafter performing a CMP process to remove excess portions of the cap material positioned on top of the layer of insulating material 30.

Figure 2N:
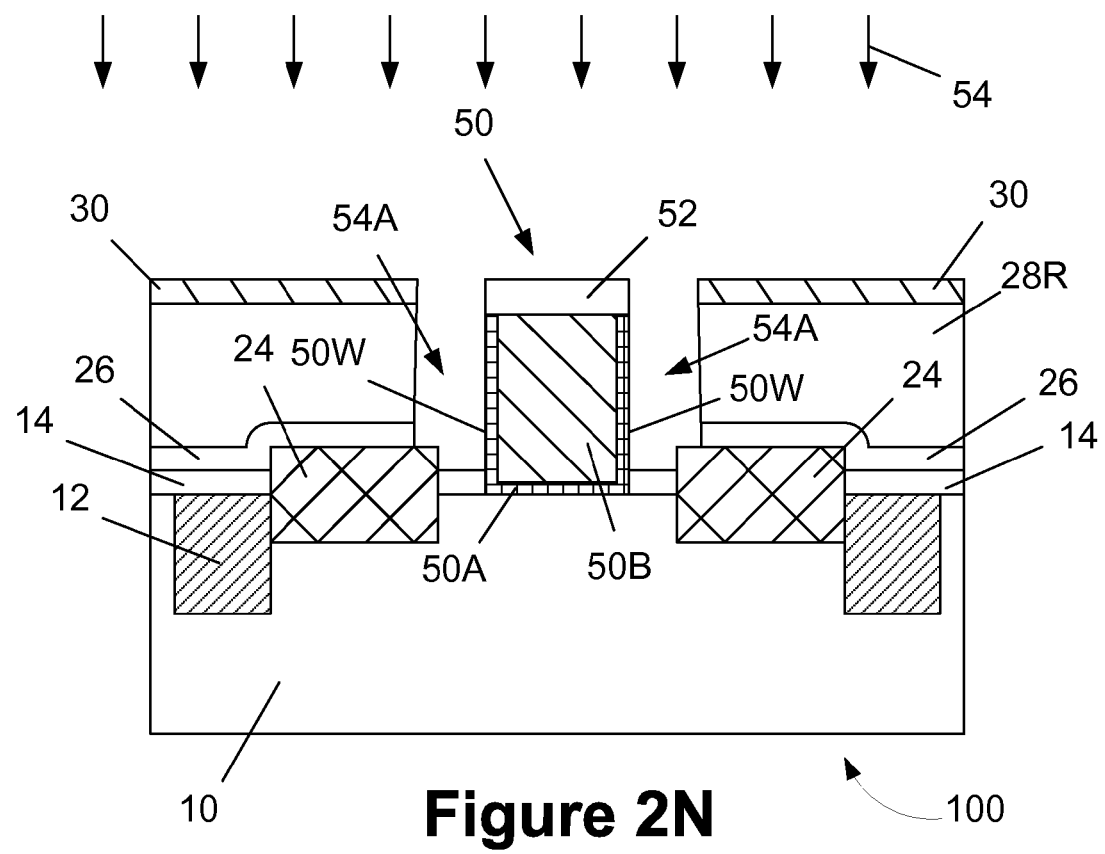

Then, as shown in FIG. 2N, an etching process 54 is performed to remove the residual portions of the first and third sacrificial sidewall spacers 20, 38. The etching process 54 results in the formation of second spacer cavities or low-k spacer cavities 54A adjacent the replacement gate structure 50. More specifically, the etching process 54 exposes the sidewall 50W of the replacement gate structure 50, i.e., it exposes the gate insulation layer 50A. The etching process 54 may be a dry or wet etching process. In the illustrative case where the first and third sacrificial sidewall spacers 20, 38 are made of carbon, the etching process may be performed using a mild plasma chemistry, such as, for example, oxygen-based ashing with mild power, or a wet $H_2O_2/H_2SO_4$ based chemistry.

Figure 2O:
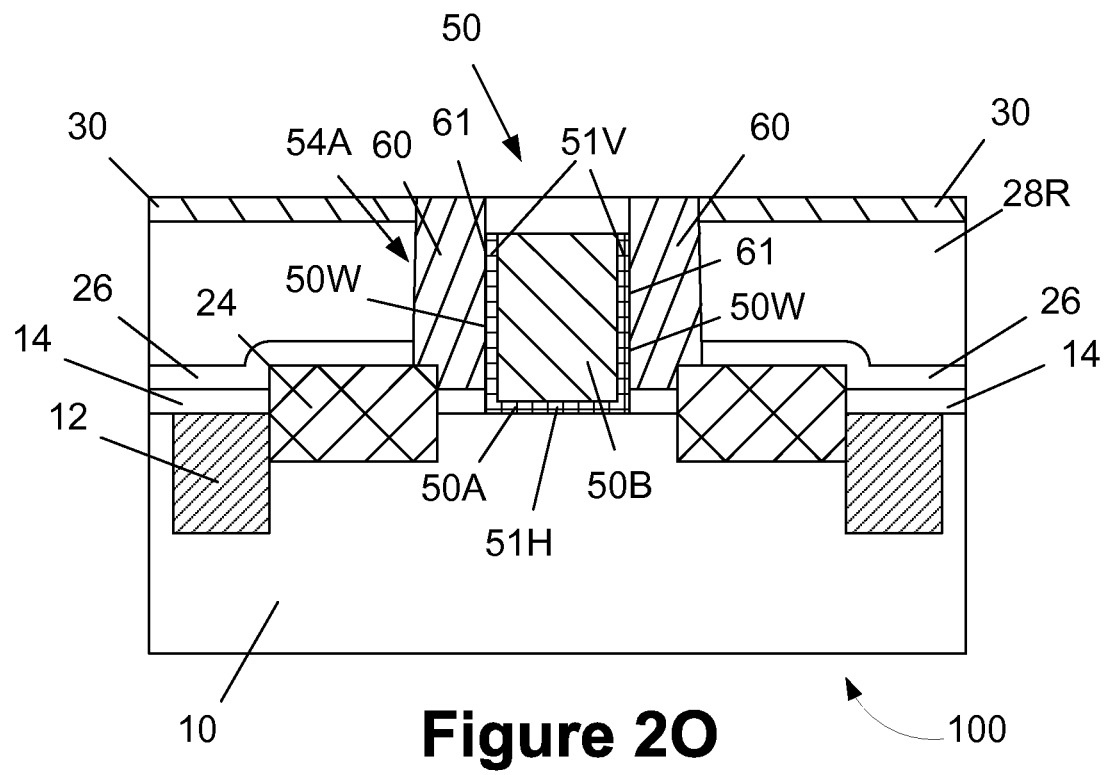

FIG. 2O depicts the device 100 after a plurality of low-k sidewall spacers 60 have been formed in the second spacer cavities 54A adjacent the replacement gate structure 50. The structure depicted in FIG. 2O is the result of several process operations. Initially, in one embodiment, a layer of low-k insulating material (not shown) is blanket-deposited across the device 100 above the layer of insulating material 30. Thereafter, excess portions of the low-k insulating material positioned outside of the second spacer cavities 54A may be removed by performing a dry etch-back process or by performing a CMP process. As used herein and in the claims, as it relates to the formation of the low-k spacers 60, the term "low-k material" or "low-k spacer" should be understood to mean any material having a dielectric constant less than that of traditional spacer material—silicon nitride, i.e., "low-k spacer" or "low-k material" means a material with a k value less than 7. Some illustrative materials that may be used for the low-k spacers 60 include, for example, SiCN, SiBN, SiOCN and SiBCN. The low-k material for the low-k spacers 60 may be formed by performing a CVD process, an ALD process, etc. Note that, in this example, the low-k spacers 60 are formed after the source/drain anneal processes have been performed on the device 100 so the low-k spacers 60 will not be degraded by being subjected to such an anneal process. Additionally, in the depicted embodiment, the low-k spacers 60 actually engage the gate insulation layer 50A of the replacement gate structure 50. More specifically, the gate insulation layer 50A depicted herein has a generally "U" shaped configuration with a substantially horizontal portion 51H (that contacts the substrate 10) and two upstanding vertically oriented (relative to the surface of the substrate) portions 51V. In the depicted example, the inside surface 61 of the low-k spacers 60 engages the vertically oriented portions 51V of the gate insulation layer 50A along substantially the entire length (in the vertical direction normal to the surface of the substrate 10) of the vertical portions 51V of the gate insulation layer 50A.

At the point of fabrication depicted in FIG. 2O, traditional manufacturing operations may be performed to complete the formation of the device 100. For example, contact openings (not shown) may be formed through the layers of insulating material 30, 28R, 26 to expose the underlying source/drain regions 24. Thereafter metal silicide regions (not shown) may be formed on the exposed portions of the source/drain regions 24 and conductive contacts (not shown) may be formed in the contact openings to provide electrical connection to the source/drain regions 24. Various metallization layers may then be formed above the device 100 using known processing techniques.

Figure 2P:
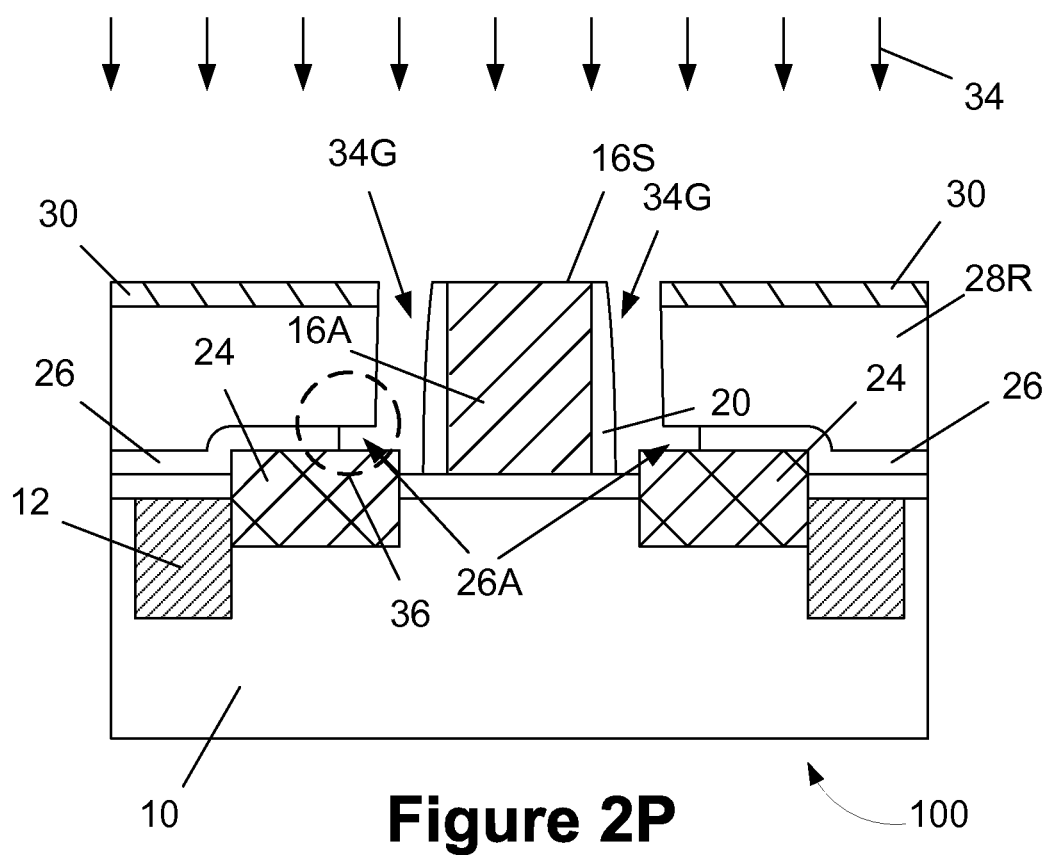
Figure 2Q:
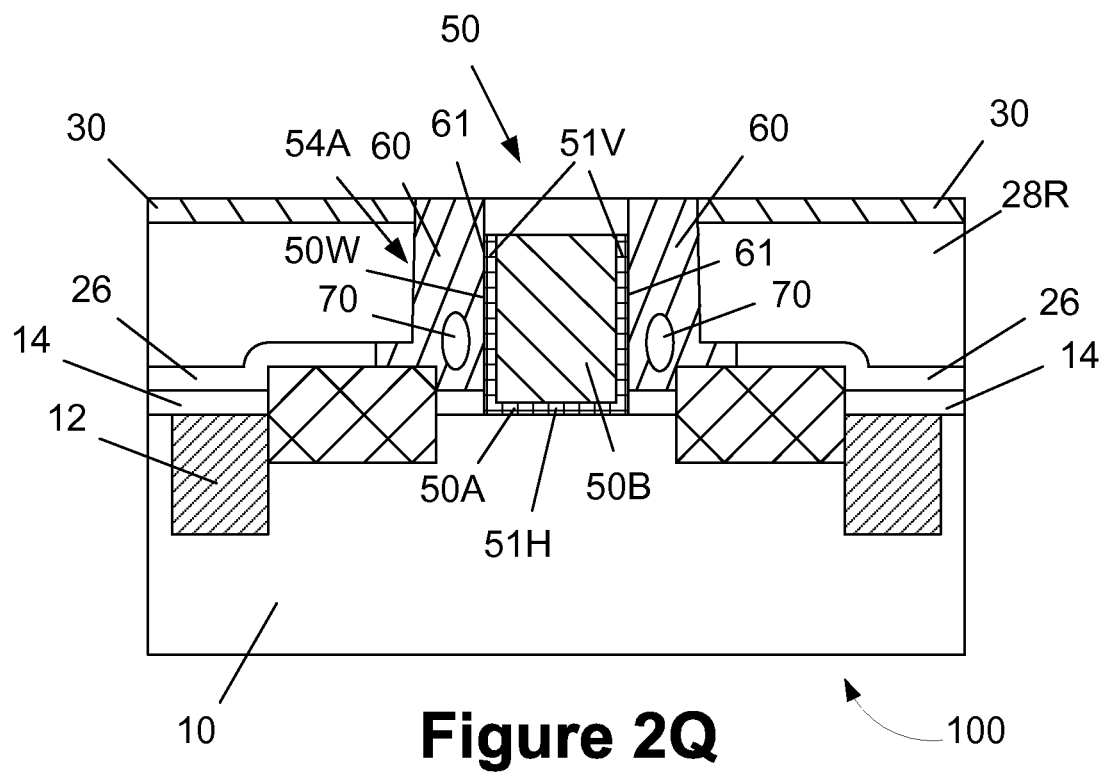

FIGS. 2P-2Q depict another illustrative embodiment disclosed herein. FIG. 2P corresponds to the point of fabrication depicted in FIG. 2I wherein the wet etching process 34 is performed to remove the residual portions of the second sacrificial sidewall spacers 22 and the layer of insulating material 26, i.e., the etching process 34 removes exposed silicon nitride material while leaving the first sacrificial sidewall spacers 20 intact. The etching process 34 results in the formation of a plurality of first spacer cavities or gaps 34G adjacent the first sacrificial sidewall spacers 20. However, in this embodiment, the parameters of the etching process 34 are controlled so as to intentionally recess the layer of insulating material 26, i.e., to intentionally form recesses 26A in the area 36, as shown in FIG. 2P. Thereafter, as shown in FIG. 2Q, processing is continued as described above until it is time to form the low-k sidewall spacers 60 in the second spacer cavities 54A adjacent the replacement gate structure 50. Due to the formation of the recesses 26A in the layer of insulating material 26, illustrative voids 70 are formed within the sidewall spacers 60. That is, the low-k material tends to fill the recesses 26A first and then "pinch-off" as the remainder of the cavity 54A is filled with low-k material, thereby resulting in the formation of the illustrative voids 70. The size and configuration of the voids 70 may vary, but their presence within the low-k sidewall spacers 60 effectively reduces the overall k value of the low-k sidewall spacers. The size of the voids 70 may be determined, at least in part, based upon the size of the recesses 26A formed in the layer of insulating material 26.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a sacrificial gate structure above a semiconducting substrate;
   forming at least one sacrificial sidewall spacer adjacent said sacrificial gate structure;
   removing at least a portion of said sacrificial gate structure to thereby define a gate cavity that is laterally defined by said at least one sacrificial sidewall spacer;
   forming a replacement gate structure, comprising a gate insulation layer comprising a substantially horizontal portion and two substantially vertical portions that have a vertical height, wherein the two substantially vertical portions are formed so as to be positioned on the at least one sacrificial sidewall spacer in said gate cavity;
   after forming said replacement gate structure, forming a gate cap layer above said replacement gate structure and between said at least one sacrificial sidewall spacer;
   after forming said gate cap layer, removing said at least one sacrificial sidewall spacer to thereby define a spacer cavity adjacent said two substantially vertical portions of said gate insulation layer of said replacement gate structure; and
   forming a low-k spacer in said spacer cavity by performing a deposition process to forms a low-k material in said spacer cavity and performing a chemical mechanical polishing process to remove excess amounts of said low-k material positioned outside of said spacer cavity such that said low-k spacer in said spacer cavity is positioned horizontally adjacent to and against substantially the entire vertical height of the substantially vertical portions of the gate insulation layer of the replacement gate structure and such that an upper surface of said low-k spacer is substantially planar with an upper surface of said gate cap layer.

2. The method of claim 1, wherein said sacrificial sidewall spacer is comprised of carbon or a material that exhibits etch selectivity relative to silicon nitride or silicon dioxide.

3. The method of claim 1, wherein said low-k sidewall spacer is comprised of a material having a k value of less than 7.

4. The method of claim 1, wherein said sacrificial gate structure is comprised of a silicon dioxide gate insulation layer and a polysilicon gate electrode positioned above said gate insulation layer.

5. The method of claim 1, wherein said gate insulation layer comprised of a high-k insulating material and a gate electrode comprised of at least one layer of metal.

6. The method of claim 1, wherein said step of removing at least a portion of said sacrificial gate structure comprises performing at least one etching process to remove a sacrificial gate electrode and a sacrificial gate insulation layer of said sacrificial gate structure.

7. The method of claim 1, wherein said step of removing said at least one sacrificial sidewall spacer to thereby define said spacer cavity comprises performing at least one etching process to remove said sacrificial sidewall spacer.

8. The method of claim 1, wherein prior to forming said gate cap layer, the method further comprises performing a recess etching process to remove at least a portion of said sacrificial gate structure.

9. A method, comprising:
   forming a sacrificial gate structure above a semiconducting substrate;
   forming at least one sacrificial sidewall spacer adjacent said sacrificial gate structure;
   performing at least one etching process to remove at least a portion of said sacrificial gate structure to thereby define a gate cavity that is laterally defined by said at least one sacrificial sidewall spacer;
   forming a replacement gate structure in said gate cavity, wherein said replacement gate structure comprises a gate insulation layer comprising a substantially horizontal portion and two substantially vertical portions, comprised of a high-k insulating material, that have a vertical height, wherein the two substantially vertical portions are formed so as to be positioned on the at least one sacrificial sidewall space; and a gate electrode comprised of at least one layer of metal;
   after forming said replacement gate structure, forming a gate cap layer above said replacement gate structure and between said at least one sacrificial sidewall spacer;
   after forming said gate cap layer, removing said at least one sacrificial sidewall spacer to thereby define a spacer cavity adjacent said two substantially vertical portions of said gate insulation layer of said replacement gate structure; and
   forming a low-k spacer in said spacer cavity by performing a deposition process to form a low-k material in said spacer cavity and performing a chemical mechanical polishing process to remove excess amounts of said low-k material positioned outside of said spacer cavity such that said low-k spacer in said spacer cavity is positioned horizontally adjacent to and against substantially the entire vertical height of the substantially vertical portions of the gate insulation layer of the replacement gate structure and such that an upper surface of said low-k spacer is substantially planar with an upper surface of said gate cap layer.

10. The method of claim 9, wherein said sacrificial sidewall spacer is comprised of carbon or a material that exhibits etch selectivity relative to silicon nitride or silicon dioxide.

11. The method of claim 9, wherein said low-k sidewall spacer is comprised of a material having a k value of less than 7.

12. The method of claim 9, wherein said step of performing said at least one etching process to remove at least a portion of said sacrificial gate structure comprises performing said at least one etching process to remove said sacrificial gate electrode and a sacrificial gate insulation layer of said sacrificial gate structure.

13. A method, comprising:
   forming a sacrificial gate structure above a semiconducting substrate;
   forming a first sacrificial sidewall spacer adjacent said sacrificial gate structure;
   forming a second sacrificial sidewall spacer adjacent said first sacrificial sidewall spacer;
   performing a first etching process to remove said second sacrificial sidewall spacer relative to said first sacrificial sidewall spacer to thereby define a first spacer cavity;
   forming a third sacrificial sidewall spacer in said first spacer cavity adjacent said first sacrificial sidewall spacer;
   after forming said third sacrificial sidewall spacer, removing at least a portion of said sacrificial gate structure to thereby define a gate cavity that is laterally defined by said first sacrificial sidewall spacer;
   forming a replacement gate structure in said gate cavity;
   after forming said replacement gate structure, removing at least said first and third sacrificial sidewall spacers to thereby define a second spacer cavity adjacent said replacement gate structure; and forming a low-k spacer in said second spacer cavity.

14. A method, comprising:

forming a sacrificial gate structure above a semiconducting substrate;

forming at least one sacrificial sidewall spacer adjacent said sacrificial gate structure;

removing at least a portion of said sacrificial gate structure to thereby define a gate cavity that is laterally defined by said at least one sacrificial sidewall spacer;

forming a replacement gate structure in said gate cavity;

forming a gate cap over the replacement structure;

after forming the gate cap, removing said at least one sacrificial sidewall spacer to thereby define a spacer cavity adjacent said replacement gate structure; and forming a low-k spacer in said spacer cavity such that an upper surface of said low-k spacer is substantially planar with an upper surface of said gate cap layer.

* * * * *